United States Patent
Hsu

(10) Patent No.: US 8,180,307 B2
(45) Date of Patent: May 15, 2012

(54) ELECTRIC DEVICE

(75) Inventor: Che-Wei Hsu, Taipei (TW)

(73) Assignee: Inventec Corporation, Taipei (TW)

( * ) Notice: Subject to any disclaimer, the term of this patent is extended or adjusted under 35 U.S.C. 154(b) by 650 days.

(21) Appl. No.: 12/314,470

(22) Filed: Dec. 11, 2008

(65) Prior Publication Data

US 2009/0156144 A1 Jun. 18, 2009

(30) Foreign Application Priority Data

Dec. 12, 2007 (TW) .............................. 96147498 A

(51) Int. Cl.
*H03D 5/00* (2006.01)
(52) U.S. Cl. .................. 455/142; 455/131; 455/144
(58) Field of Classification Search .......... 455/131–135, 455/142–144
See application file for complete search history.

(56) References Cited

U.S. PATENT DOCUMENTS 7,167,688 B2 1/2007 Li et al.
7,639,991 B2 * 12/2009 Kim et al. ..................... 455/101

FOREIGN PATENT DOCUMENTS

| CN | 2343973 Y | 10/1999 |
|---|---|---|
| JP | 2006340255 A | 12/2006 |
| TW | 381209 | 2/2000 |
| TW | 200505179 | 2/2005 |
| TW | 200516362 | 5/2005 |
| TW | M298861 | 10/2006 |
| TW | 200744318 | 12/2007 |

OTHER PUBLICATIONS

Taiwanese Office Action in corresponding Taiwanese Application No. 096147498 dated May 24, 2011.
Chinese Office Action in corresponding Chinese Application No. 200710300968.3 dated Dec. 31, 2011.

* cited by examiner

*Primary Examiner* — An Luu
(74) *Attorney, Agent, or Firm* — Bacon & Thomas, PLLC

(57) ABSTRACT

An electric device for receiving a radio frequency (RF) signal is provided. The electric device includes an antenna, a first power amplifier, a battery, a second filter and a second power amplifier. The antenna is used for receiving and outputting a RF signal. The first power amplifier is used for receiving the RF signal, amplifying the RF signal and outputting the RF enhanced by the first power amplifier and a feedback signal. The battery is used for providing a working voltage to the first power amplifier, and receiving and outputting the feedback signal. The second filter is used for receiving the working voltage provided by the battery and the feedback signal, filtering the feedback signal and outputting the working voltage. The second power amplifier is used for receiving the working voltage.

9 Claims, 2 Drawing Sheets

ELECTRIC DEVICE

This application claims the benefit of Taiwan application Serial No. 96147498, filed Dec. 12, 2007, the subject matter of which is incorporated herein by reference.

BACKGROUND OF THE INVENTION

1. Field of the Invention

The invention relates in general to an electric device, and more particularly to an electric device avoiding speaker quality being affected by radio frequency signal.

2. Description of the Related Art

Along with the development in science and technology, various electric devices are directed towards the trend of slimness, lightweight and compactness. As the volume of the electric device is reduced, the elements inside the electric device are more intensive and some elements can even be shared. The electric device 900 of FIG. 1 is exemplified below.

Referring to FIG. 1, a functional block diagram of a conventional electric device is shown. The electric device 900 includes an antenna 910, a first power amplifier 920, a filter 930, a baseband converter 940, an audio chip 950, a second power amplifier 960, a speaker 970 and a battery 980. The first power amplifier 920 is electrically coupled to the antenna 910 and the filter 930. The baseband converter 940 is electrically coupled to filter 930. The second power amplifier 960 is electrically coupled to the audio chip 950 and the speaker 970. Besides, the first power amplifier 920 and the second power amplifier 960 are both electrically coupled to the battery 980.

After the antenna 910 receives a radio frequency (RF) signal, the first power amplifier 920 further amplifies and outputs the RF signal to a filter 930. Then, the filter 930 filters the RF signal enhanced by the first power amplifier 920 and transmits the filtered RF signal to the baseband converter 940 for conversing a baseband of the filtered RF signal.

The second power amplifier 960 receives an audio frequency signal from the audio chip 950, and further amplifies and outputs the audio frequency signal to the speaker 970. To avoid the decay of the RF signal, the first power amplifier 920 of the antenna 910 is normally disposed around the antenna 910. This is because if the first power amplifier 920 is disposed too far away from the antenna 910, the RF signal has to travel through a longer path and is more susceptible to the influence of surrounding signals, making the impedance not uniformed and the RF signal decayed. Likewise, to avoid the decay of the audio frequency signal, the second power amplifier 960 of the speaker 970 is also disposed around the speaker 970. Therefore, the first power amplifier 920 and the second power amplifier 960 are preferably disposed around the battery 980. When the first power amplifier 920 and the second power amplifier 960 receive the voltage provided by the battery 980, a part of the RF signal is fed back to the battery 980.

As the battery 980 also provides a working voltage to the second power amplifier 960, the feedback signal fed back to the battery 980 will be transmitted to the second power amplifier 960 via the battery 980 first and then transmitted to the speaker 970 next. That is, the working voltage provided by the battery 980 contains some noise. Normally, a frequency range of a time slot frame of the feedback signal approximately 217 Hz or a frequency multiplication thereof is audible to human ears. Therefore, the user of the electric device 900 will often hear the audio signal outputted by the speaker 970 carrying a noise similar to a high frequency signal.

Under such circumstances, the requirement of slimness, lightweight and compactness in the design the electric device is met by using two batteries to avoid noise, hence jeopardizing the quality of the audio signal or the economy of the volume of the electric device.

SUMMARY OF THE INVENTION

The invention is directed to an electric device capable of removing the feedback signal transmitted to the first filter via the battery by a filter, so that the user no more hear the noise.

According to a first aspect of the present invention, an electric device for receiving a radio frequency (RF) signal is provided. The electric device includes an antenna, a first power amplifier, a battery, a first filter and a second power amplifier. The antenna is used for receiving and outputting a RF signal. The first power amplifier electrically coupled to the antenna is used for receiving the RF signal, amplifying the RF signal and outputting the RF enhanced by the first power amplifier and a feedback signal. The battery electrically coupled to the first power amplifier is used for providing a working voltage to the first power amplifier, and receiving and outputting the feedback signal. The first filter electrically coupled to the battery is used for receiving the working voltage provided by the battery and the feedback signal, filtering the feedback signal and outputting the working voltage. The second power amplifier electrically coupled to the first filter is used for receiving the working voltage.

The invention will become apparent from the following detailed description of the preferred but non-limiting embodiments. The following description is made with reference to the accompanying drawings.

DETAILED DESCRIPTION OF THE INVENTION

Figure 1:
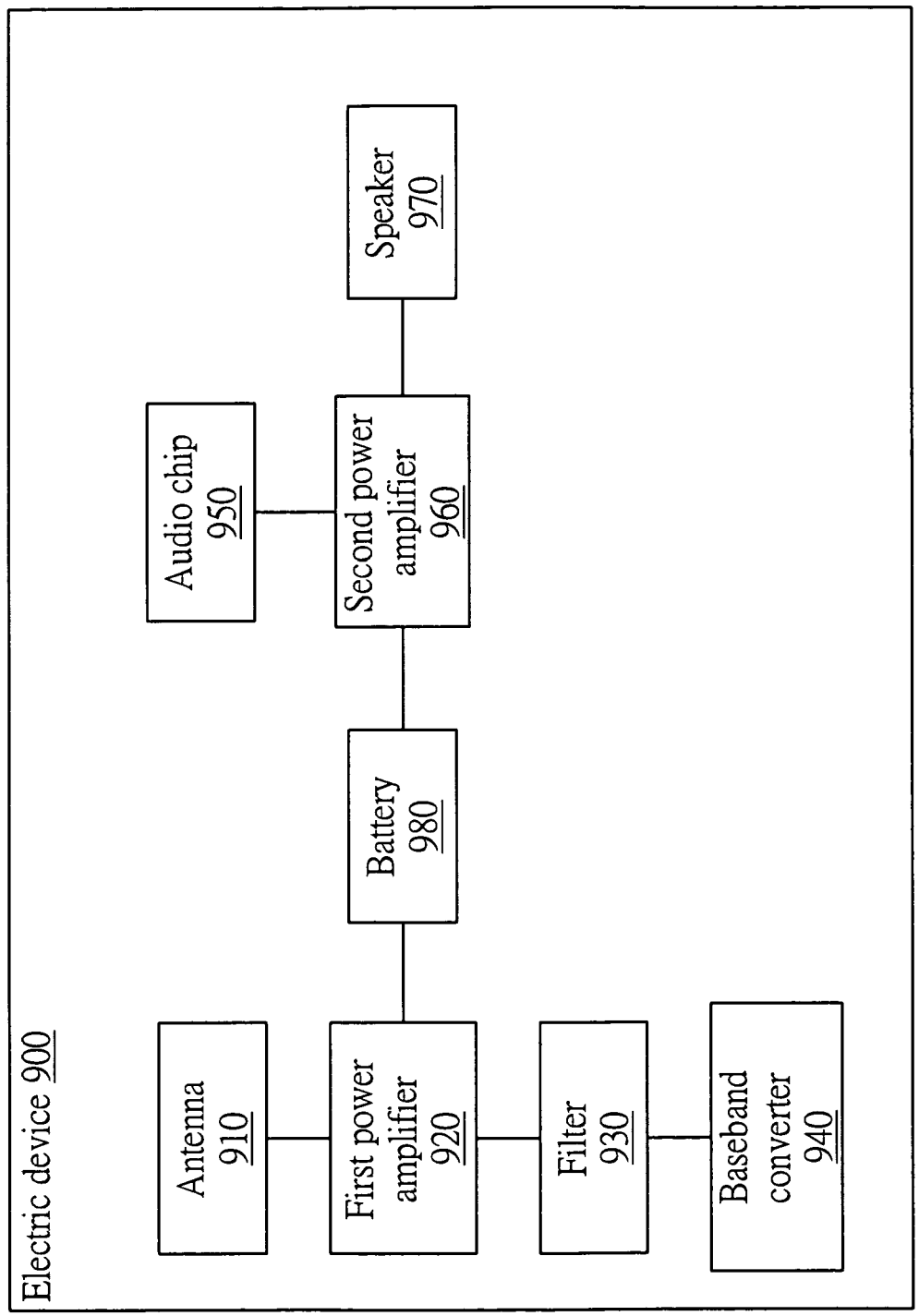
FIG. 1 (Prior Art) is a functional block diagram of a conventional electric device.
Figure 2:
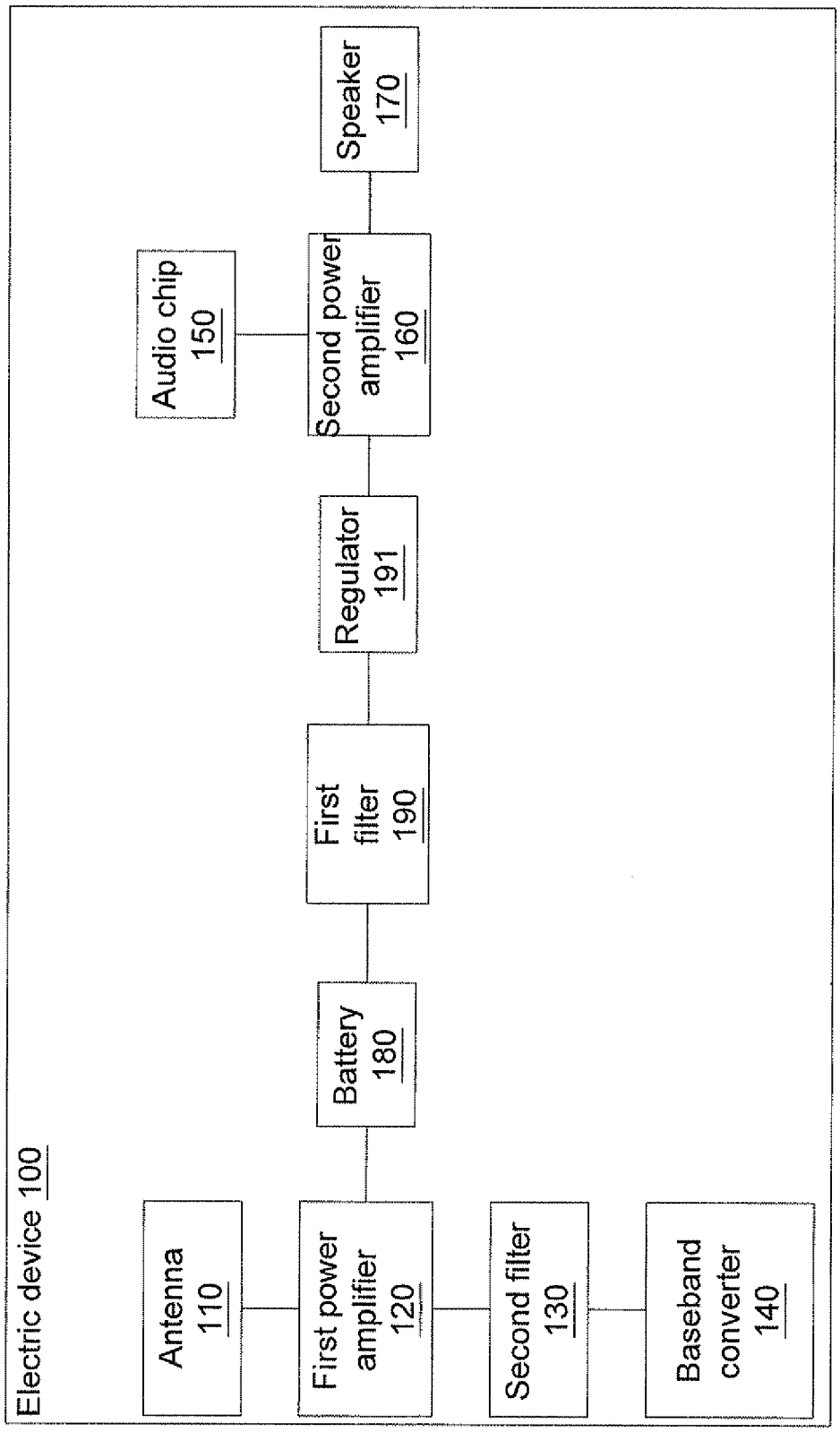
FIG. 2 is a functional block diagram of an electric device according to a preferred embodiment of the invention.

Referring to FIG. 2, a functional block diagram of the electric device 100 according to a preferred embodiment of the invention is shown. Example of the electric device 100 used for receiving a RF includes a mobile phone, a global positioning system (GPS) reception device, a radio reception device or a broadcasting reception device. The electric device 100 includes an antenna 110, a first power amplifier 120, a second filter 130, a baseband converter 140, a battery 180, a first filter 190, a regulator 191, a second power amplifier 160, an audio chip 150 and a speaker 170. On one hand, the antenna 110 of the electric device 100 is used for receiving a RF signal. The RF signal is transmitted via a first path constructed by the antenna 110, the first power amplifier 120, the second filter 130 and the baseband converter 140 for various communication processing.

The audio chip 150 of the electric device 100 is used for providing an audio frequency signal. The audio frequency signal is transmitted via a second path constructed by the audio frequency signal 150, the second power amplifier 160 and the speaker 170 for playing voice or music.

In terms of the first path, the first power amplifier 120 electrically coupled to the antenna 110 is used for receiving the RF signal, and the first power amplifier 120 is used for amplifying the RF signal.

The second filter 130 electrically coupled to the first power amplifier 120 is used for receiving the RF signal enhanced by the first power amplifier 120 and filtering the RF signal enhanced by the first power amplifier 120 off unnecessary noises.

The baseband converter 140 is electrically coupled to the second second 130 for receiving the filtered RF signal and converting a baseband of the RF signal.

In terms of the second path, the second power amplifier 160 is coupled to the audio chip 150 for amplifying the audio frequency signal and then outputting the enhanced audio frequency signal to the speaker 170.

The speaker 170 is used for receiving the enhanced audio frequency signal, converting the audio frequency signal into an audio signal, and outputting the audio signal for the user.

To avoid the decay in the RF signal of the first path, normally the first power amplifier 120 is disposed around the antenna 110. Likewise, to avoid the decay in the audio frequency signal of the second path, the second power amplifier 160 is disposed around the speaker 170. Moreover, in order to maintain the efficiency of the first power amplifier 120 and the second power amplifier 160, the first power amplifier 120 and the second power amplifier 160 are preferably disposed around the battery 180.

As indicated in FIG. 2, the battery 180 electrically coupled to the first power amplifier 120 and the second power amplifier 160 is used for providing the working voltage to both the first power amplifier 120 of the first path and the second power amplifier 160 of the second path. As the working voltage of the battery 180 is received by the first power amplifier 120, a part of the RF signal is fed back to the battery 180, and then is transmitted to other elements electrically coupled to the battery 180 such as transmitted to the second power amplifier 160 of the second path.

To eliminate the feedback signal transmitted by the second power amplifier 160, the first filter 190 is electrically coupled between the battery 180 and the second power amplifier 160 for receiving the working voltage provided by the battery 180 and the feedback signal. After the first filter 190 filters the feedback signal, the first filter 190 further outputs the working voltage free of the feedback signal to the second power amplifier 160. The second power amplifier 160 is electrically coupled to the first filter 190. Meanwhile, the working voltage received by the second power amplifier 160 is free of noise.

The difference between various types of filter including low-pass filter, high-pass filter, band-pass filter and band-stop filter lies in the specification of signal conversion.

Low-pass filter allows low frequency signal to pass through but weakens or reduces the signal whose frequency is higher than the cut-off frequency. Different signal frequencies are weakened to different levels by different filters. When audio frequency signal is used, the low-pass filter is also called a high frequency clipping filter or a high pitch elimination filter.

Low-pass filter has various applications such as hiss filter used in audio frequency equipment, digital algorithm for smooth data, acoustic barriers and image blurring processing.

Generally speaking, the feedback signal is 5%~10% of the RF signal. When a frequency range of a time slot frame of the feedback signal is 210 Hz~220 Hz or a frequency multiplication thereof, such frequency range is audible to human ears. Low-pass filter can effectively filter the signal of 210 Hz~220 Hz or a frequency multiplication thereof, and the first filter 190 is exemplified by a low-pass filter (LPF) in the present embodiment of the invention.

Besides, the electric device 100 further includes a regulator 191 electrically coupled between the first filter 190 and the second power amplifier 160 for regulating the level of the working voltage and suppressing the signal lacking of direct current component.

The regulator 191 can adopt a low noise regulator such as a low dropout (LDO) regulator to match the frequency range of the feedback signal.

The battery 180 provides the working voltage to both the first power amplifier 120 of the first path and the second power amplifier 160 of the second path. Despite the feedback signal of the first power amplifier 120 is transmitted to the second power amplifier 160 via the battery 180, the working voltage received by the second power amplifier 160 is free of noise through the above arrangement of filtering the noise by the first filter 190 and suppressing the signal lacking of direct current component by the regulator 191. Therefore, the audio frequency signal of the second path will not be affected, and the audio frequency signal audible to the user no more contains noise.

With a filter and a regulator, the electric device disclosed in the above embodiment of the invention is capable of eliminating the feedback signal transmitted to the speaker via the battery and has the following advantages.

Firstly, with the adoption of a filter and a regulator, the signal received by the speaker is already filtered and the working voltage is regulated and no more contains noise, so that the outputted audio frequency signal audible to the user is free of noise.

Secondly, as the audio frequency signal no more generates noise, the first power amplifier and the second power amplifier can share the same battery, making the electric device more conformed to the trend of slimness, lightweight and compactness without affecting the quality of the audio frequency signal.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electric device is used for receiving a radio frequency (RF) signal, wherein the electric device comprises:
    an antenna used for receiving and outputting the RF signal;
    a first power amplifier electrically coupled to the antenna, wherein the first power amplifier is used for receiving the RF signal, amplifying the RF signal and outputting the RF signal enhanced by the first power amplifier and a feedback signal;
    a battery electrically coupled to the first power amplifier, wherein the battery is used for providing a working voltage to the first power amplifier, and receiving and outputting the feedback signal;
    a first filter electrically coupled to the battery, wherein the first filter is used for receiving the working voltage provided by the battery and the feedback signal, and filtering the feedback signal and outputting the working voltage, and the battery is disposed between the first power amplifier and the first filter;
    a second power amplifier electrically coupled to the first filter, wherein the second power amplifier is used for receiving the working voltage; and
    a regulator electrically coupled between the first filter and the second power amplifier for adjusting a level of the working voltage.

2. The electric device according to claim 1, wherein the regulator is a low noise regulator.

3. The electric device according to claim 1, wherein the regulator is a low dropout regulator (LDO Regulator).

4. The electric device according to claim 1, wherein the electric device is a mobile phone, a global positioning system (GPS) reception device, a radio reception device or a broadcasting reception device.

5. The electric device according to claim 1, wherein a frequency range of a time slot frame of the feedback signal is 210 Hz~220 Hz.

6. The electric device according to claim 1, wherein a frequency range of a slot frame of the feedback signal is a frequency multiplication of 210 Hz~220 Hz.

7. The electric device according to claim 1, wherein the feedback signal is 5%~10% of the RF signal.

8. The electric device according to claim 1, further comprising:
- an audio chip electrically coupled to the second power amplifier, wherein the audio chip is used for generating and outputting an audio frequency signal to the second power amplifier; and
- a speaker electrically coupled to the second power amplifier, wherein the speaker is used for receiving and outputting the audio frequency signal enhanced by the second power amplifier.

9. The electric device according to claim 1, further comprising:
- a second filter electrically coupled to the first power amplifier, wherein the second filter is used for receiving the RF signal, filtering the RF signal and outputting the filtered RF signal; and
- a baseband converter electrically coupled to the second filter, wherein the baseband converter is used for receiving and converting a baseband of the filtered RF signal.

* * * * *